United States Patent
Nguyen et al.

(10) Patent No.: US 7,230,960 B2
(45) Date of Patent: Jun. 12, 2007

(54) TUNABLE EXTERNAL CAVITY LASER WITH ADJUSTABLE CAVITY LENGTH AND MODE-HOP SUPPRESSION

(75) Inventors: Hoang Nguyen, Livermore, CA (US); Dong Ho Choi, Palo Alto, CA (US); Ross D. Pace, San Jose, CA (US); Thang Tran, San Jose, CA (US); Weizhi Wang, San Jose, CA (US); Alan Lim, San Jose, CA (US)

(73) Assignee: Bookham Technology PLC, Abingdon (GB)

( * ) Notice: Subject to any disclaimer, the term of this patent is extended or adjusted under 35 U.S.C. 154(b) by 262 days.

(21) Appl. No.: 10/808,732

(22) Filed: Mar. 24, 2004

(65) Prior Publication Data

US 2005/0129073 A1    Jun. 16, 2005

Related U.S. Application Data

(60) Provisional application No. 60/457,510, filed on Mar. 24, 2003.

(51) Int. Cl.
H01S 3/121 (2006.01)
H01S 3/10 (2006.01)
H01S 3/13 (2006.01)
H01S 3/08 (2006.01)

(52) U.S. Cl. ............ 372/20; 372/14; 372/29.022; 372/102

(58) Field of Classification Search ............... 372/14, 372/20, 29.022, 102
See application file for complete search history.

(56) References Cited

U.S. PATENT DOCUMENTS

| 5,923,418 | A  | * | 7/1999 | Clark et al. | 356/153 |
|---|---|---|---|---|---|
| 6,108,355 | A  |   | 8/2000 | Zorabedian | 372/20 |
| 6,205,159 | B1 |   | 3/2001 | Sesko et al. | 372/20 |
| 6,282,215 | B1 |   | 8/2001 | Zorabedian et al. | 372/20 |
| 6,847,661 | B2 | * | 1/2005 | Jerman et al. | 372/20 |
| 6,912,235 | B2 | * | 6/2005 | Anthon et al. | 372/29.02 |
| 2001/0036206 | A1 |   | 11/2001 | Jerman et al. | |
| 2002/0012377 | A1 | * | 1/2002 | Suganuma et al. | 372/98 |
| 2003/0007523 | A1 |   | 1/2003 | Chapman et al. | |

FOREIGN PATENT DOCUMENTS

EP    0 951 112 A    10/1999

OTHER PUBLICATIONS

International Search Report mailed Mar. 23, 2006, for PCT Application No. PCT/US04/09067, filed Mar. 24, 2004, three pages.
Godard, A. et al. (Apr. 2002). "Side-Mode Gain in Grating-Tuned Extended-Cavity Semiconductor Lasers: Investigation of Stable Single-Mode Operation Conditions," *IEEE Journal of Quantum Electronics* 38(4):390-401.
Supplementary European Search Report mailed Aug. 22, 2006, for EP Application No. 04758129.3, four pages.
Wenz, H. et al. (Feb. 1996). "Kontinuierlich Durchstimmbarer Halbleiterlaser Continuously Tunable Diode Laser," *Laser und Optoelektronik* 28(1):58-62 (Abstract and Extended Abstract in English.).

* cited by examiner

*Primary Examiner*—Armando Rodriguez
(74) *Attorney, Agent, or Firm*—Morrison & Foerster LLP (57) ABSTRACT

Tunable external cavity lasers are used in applications such as interferometry, FM spectroscopy, and optical communications equipment testing. Mode hop free high bandwidth frequency modulation operation is desired in a tunable external cavity laser. This application describes new and novel techniques for controlling the output wavelength of a tunable external cavity laser while suppressing mode hop.

33 Claims, 14 Drawing Sheets

TUNABLE EXTERNAL CAVITY LASER WITH ADJUSTABLE CAVITY LENGTH AND MODE-HOP SUPPRESSION

RELATED APPLICATIONS

This application claims priority under 35 U.S.C. 119(e) to provisional application No. 60/457,510 filed on Mar. 24, 2003 titled "TUNABLE EXTERNAL CAVITY LASER WITH MOVABLE DIODE ASSEMBLY AND MODE-HOP SUPPRESSION."

FIELD

The invention relates to lasers, and more specifically to tunable external cavity lasers.

BACKGROUND

A tunable external cavity laser is a device that allows a user to select the output wavelength of light from a range of wavelengths available from the device. Each tunable external cavity laser has a range, 1500 to 1620 nm for example, of adjustable wavelength selection. The user has an ability to select any one wavelength within the range to amplify and emit from the system.

By rapidly selecting successive wavelengths of light, wavelength modulation of the light is achieved. This wavelength modulation is very useful for spectroscopy (used in chemistry and biochemistry) and optical communication equipment testing. By using wavelength modulation, low frequency noise is eliminated from a test signal. Accordingly, higher rates of wavelength modulation in a tunable external cavity laser are almost always desirable.

The tunable external cavity laser is centered around a gain medium. The gain medium amplifies light in a given wavelength range for a given device and is well known in the art. A commonly used gain medium for an external cavity laser is a laser diode with an antireflective coating. The antireflective coating reduces residual reflections, which encourages single mode operation. A mode refers to a single wavelength of light. A laser diode emits many different wavelengths of light, which are tightly clustered together, 1500 to 1620 nm for example. Laser diodes are sometimes characterized by the center wavelength, which is the wavelength in the center of the wavelength range that the laser diode emits. Other commonly known gain mediums, such as gas, can also be used, but their large size may not be desirable.

In order to amplify a specific wavelength of light, that specific wavelength should be reflected back into the gain medium. In a system where a single output wavelength is desired, it is necessary to select a single wavelength of light to be directed back to the gain medium. One technique is to use a diffraction grating and a retroreflector. This arrangement is known as a Littman configuration.

Figure 1:
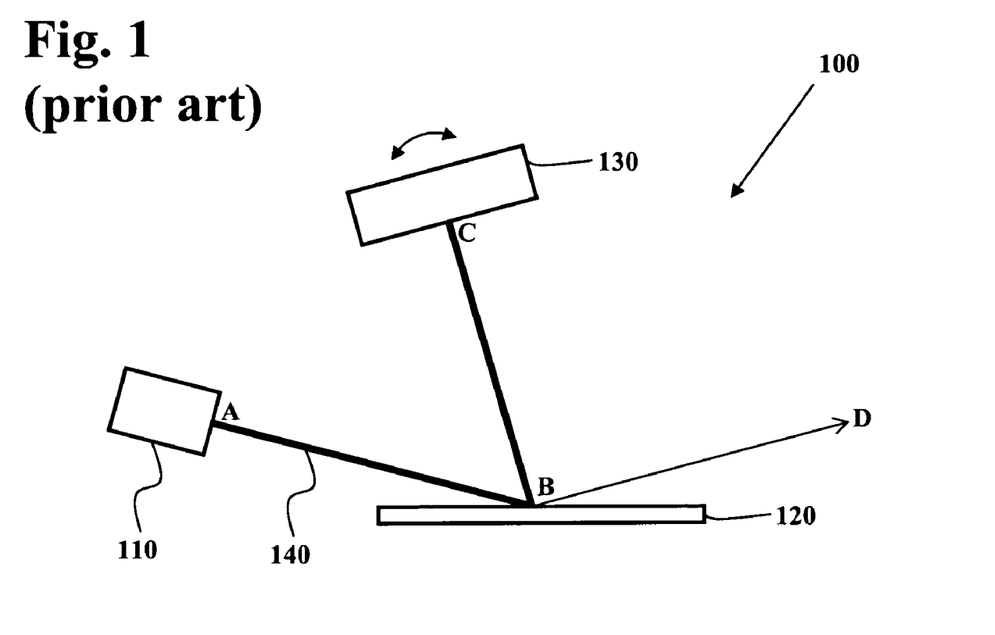
FIG. 1 shows an example of a prior art tunable external cavity laser.

FIG. 1 shows a prior art example of a tunable external cavity laser 100. A beam 140 of light with multiple wavelengths leaves the gain medium 110 at point A and strikes the diffraction grating 120 at point B. Each wavelength of light diffracts off the diffraction grating 120 at a different angle. A retroreflector 130 is rotated relative to the diffraction grating 120 to select the wavelength of light that is desired to be amplified. Only the light which diffracts off of the diffraction grating 120 at point B and hits the retroreflector 130 at point C such that its path B–C is perpendicular to the retroreflector 130 is reflected by the retroreflector 130 such that its return path is C-B-A. The returning light gets amplified when it traverses again through the gain medium 110. The wavelength of the light that experiences amplification through multiple reflections is determined by the angle between the retroreflector 130 and the diffraction grating 120. The path A–B–C forms the cavity of the tunable external cavity laser 100.

Because only one wavelength of light is reflected back into the gain medium 110, only that wavelength of light is amplified. The light emitted from the gain medium 110, therefore, has one dominant wavelength with insignificant amounts of all of the other wavelengths created by the gain medium 110.

Some of the light emitted from the gain medium 110 reflects off of the diffraction grating 120 and exits the system toward point D. This light comprises the output of the tunable external cavity laser 100. It should be apparent that changing the angle of the retroreflector 130 relative to the diffraction grating 120 results in the amplification, and, therefore, output of a different wavelength of light.

One important aspect of a tunable external cavity laser is that the cavity length should be a constant multiple of the selected wavelength of light. As the output wavelength is tuned from one wavelength to another, the cavity length needs to be changed such that the number of wavelengths in the length of the external cavity laser 100 remains constant. If not, mode hop can occur. Mode hop is an unintended switch from the desired wavelength to a nearby wavelength. The minimization or elimination of a mode hop is highly desired.

Figure 2A:
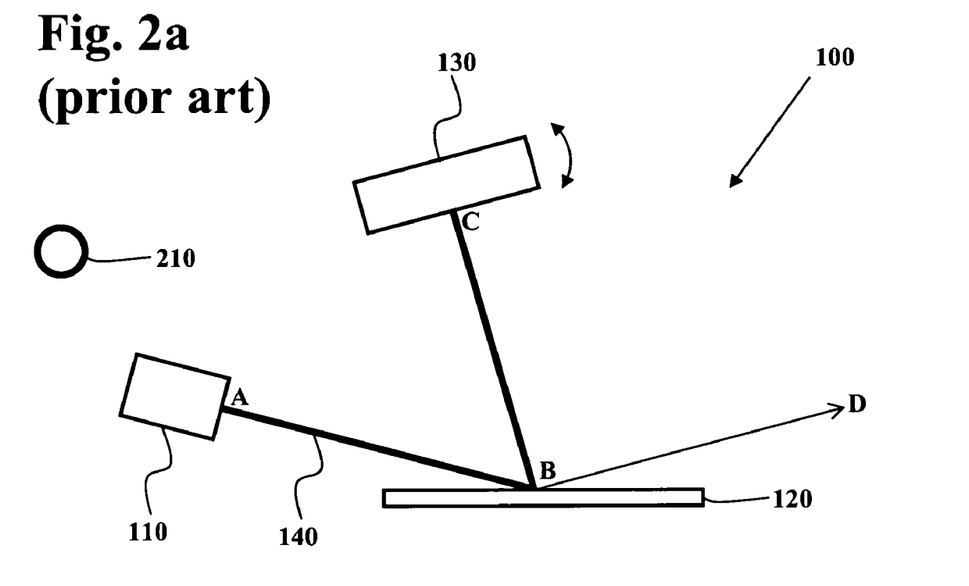
FIG. 2A shows an example of a prior art tunable external cavity laser.

FIG. 2A shows a prior art example of a tunable external cavity laser 100 where wavelength selection and cavity length adjustment is achieved in one physical movement. The retroreflector 130 rotates about a pivot 210. The retroreflector 130 rotates relative to the diffraction grating 120 and the distance B–C (hence the cavity length) changes as the retroreflector 130 rotates about the pivot 210. Proper placement of the pivot 210 is critical. Unfortunately, manufacturing costs may be relatively high due to the tight tolerances. In addition, it may be difficult or impossible to ideally match the cavity length to all possible wavelengths emitted by the gain medium 110. Furthermore, the effects of wear during the life of the system and the effects of thermal fluctuation can cause undesired changes in the cavity length, which can lead to mode hop.

Prior art tunable external cavity lasers have used DC servo motors, stepper motors, and rotary voice coil actuators to rotate the retroreflector relative to the diffraction grating. DC servo motors and stepper motors often require transmissions to achieve the desired amount of movement resolution. Unfortunately these transmissions wear out, require significant power to move, and have limited positional accuracy. In addition, DC servo motors and stepper motors do not have the desired speed to attain high frequency modulation. Rotary voice coil actuators, such as those used in hard disc drives, work very well, but they are quite large and limit miniaturization of the device.

Figure 2B:
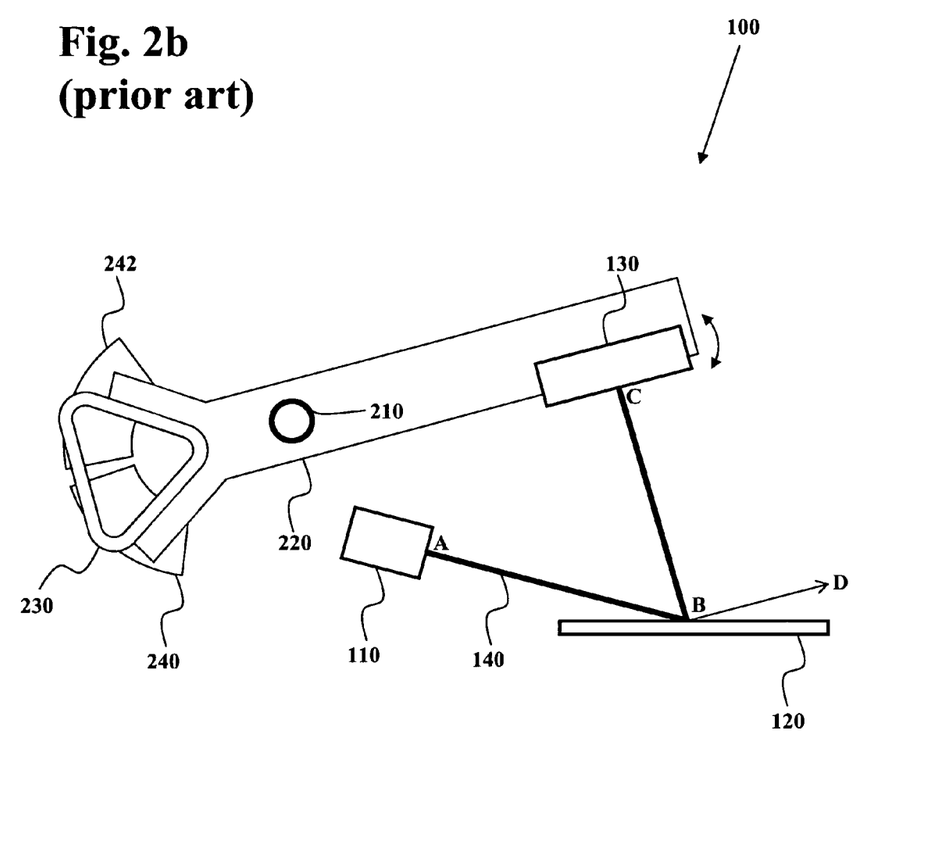
FIG. 2B shows an example of a prior art tunable external cavity laser with a voice coil actuator.

FIG. 2B shows an example of a prior art tunable external cavity laser with a rotary voice coil actuator, the type that may also be used in a hard disk drive. The voice coil actuator arm 220 rotates around pivot 210. The retroreflector 130 is attached to the actuator arm 220. The voice coil 230 is also attached to the actuator arm 220. The voice coil 230 interacts with the magnets 240, 242 to control the position of the actuator arm 220.

There is a need for a tunable external cavity laser with a high frequency modulation, excellent wavelength selection accuracy, mode hop free operation, long life, low-cost, and small form factor.

SUMMARY

This document describes a tunable external cavity laser with a gain medium, a diffraction grating, and a retroreflector, where the distance between the gain medium and the diffraction grating is adjustable. This document also describes a method of controlling the output from a tunable external cavity laser by both rotating the retroreflector to select a wavelength of light to amplify and adjusting the cavity length.

DESCRIPTION

This document describes several different embodiments of a new and novel tunable external cavity laser. By using two actuators, one to rotate a retroreflector (thereby selecting the wavelength of light to amplify) and one to change the cavity length, a tunable external cavity laser is created that virtually eliminates mode hop. Such a device is also inexpensive to manufacture. In addition, by selecting the appropriate actuators, higher frequency modulation can be attained than was previously possible. It is also possible to create a tunable external cavity laser that is smaller than was previously possible. A small form factor is desirable, as it allows the external cavity laser to be more portable and easier to interface with other systems. It is also possible to introduce one or more feedback control loops into the laser system that monitor properties of the light in order to control the quality of the light and suppress mode hop.

Figure 3:
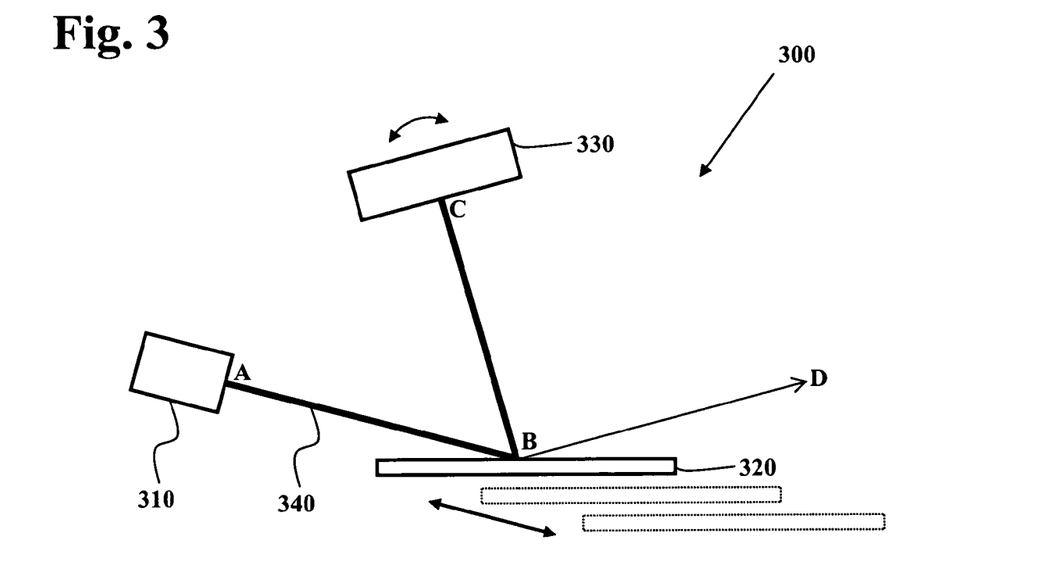
FIG. 3 shows an example of a tunable external cavity laser with a movable diffraction grating.

FIG. 3 shows an example of a tunable external cavity laser 300. In this example, a beam 340 of light is emitted from a gain medium 310 at point A. The light diffracts off of a diffraction grating 320 at point B. The light then strikes a retroreflector 330 at point C. The light then reverses its path from C to B to A and is amplified in the gain medium 310. Some of the light reflects off of the diffraction grating 320 and exits the system toward point D. The retroreflector 330 can be rotated relative to the diffraction grating 320 in order to select the desired wavelength of light to be amplified. The cavity length can be adjusted by moving the diffraction grating 320 along an axis that is parallel to the beam 340 between points A and B. Other translations of the diffraction grating 320 can also be used as long as they only affect the cavity length.

Figure 4:
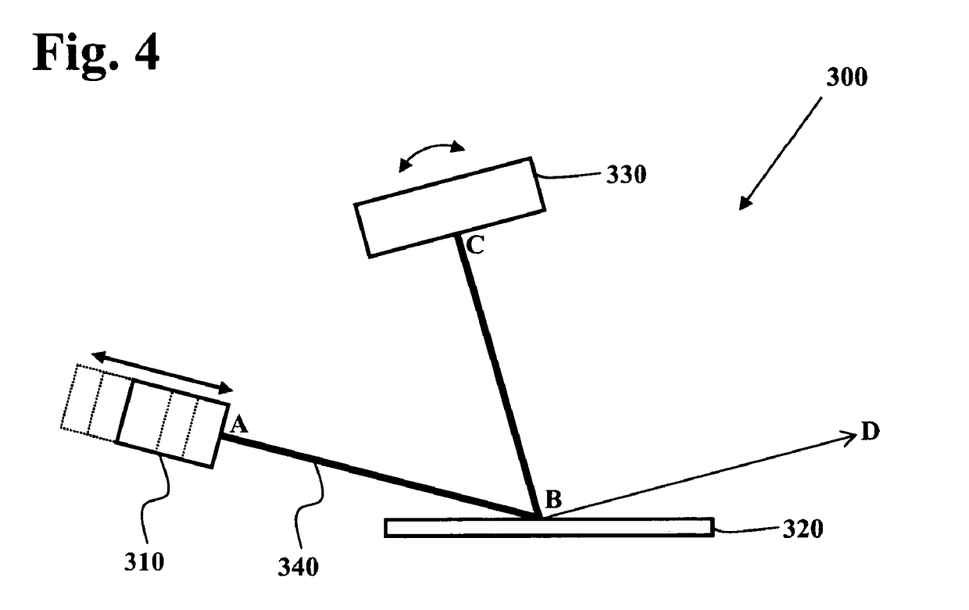
FIG. 4 shows an example of a tunable external can be laser with a movable gain medium.

FIG. 4 shows another example of a tunable external cavity laser 300. In this example, the gain medium 310 moves along an axis that is parallel to the beam 340 between points A and B. As with FIG. 3, modifying the distance between the gain medium 310 and the diffraction grating 320 does not change the selected wavelength. Moving the gain medium 310 only affects segment A–B of the cavity length, while moving the diffraction grating 320 will affect both segments A–B and B–C. Therefore, moving the diffraction grating 320 will in general have a greater sensitivity (the same magnitude of movement achieving a greater change in the cavity length).

Translation of the gain medium 310 or diffraction grating 320 may be accomplished by using a voice coil actuator or a piezoelectric actuator. In this example, the translation is in the 1–50 micron range, with a resolution or positional accuracy of a few nanometers. Of course, the actual amount of movement required depends upon the wavelength range of the light being emitted from the gain medium 310. Therefore, other ranges of translation and positional accuracy may be more appropriate to another situation.

Rotation of the retroreflector 330 may be accomplished by using a voice coil actuator. Voice coil actuators have advantages over DC servo motors and stepper motors as discussed above. Their low power consumption, high positional accuracy, and high sweep rate are all advantageous in this application. Rotary, linear, or other types of voice coil actuators may be appropriate.

Figure 5A:
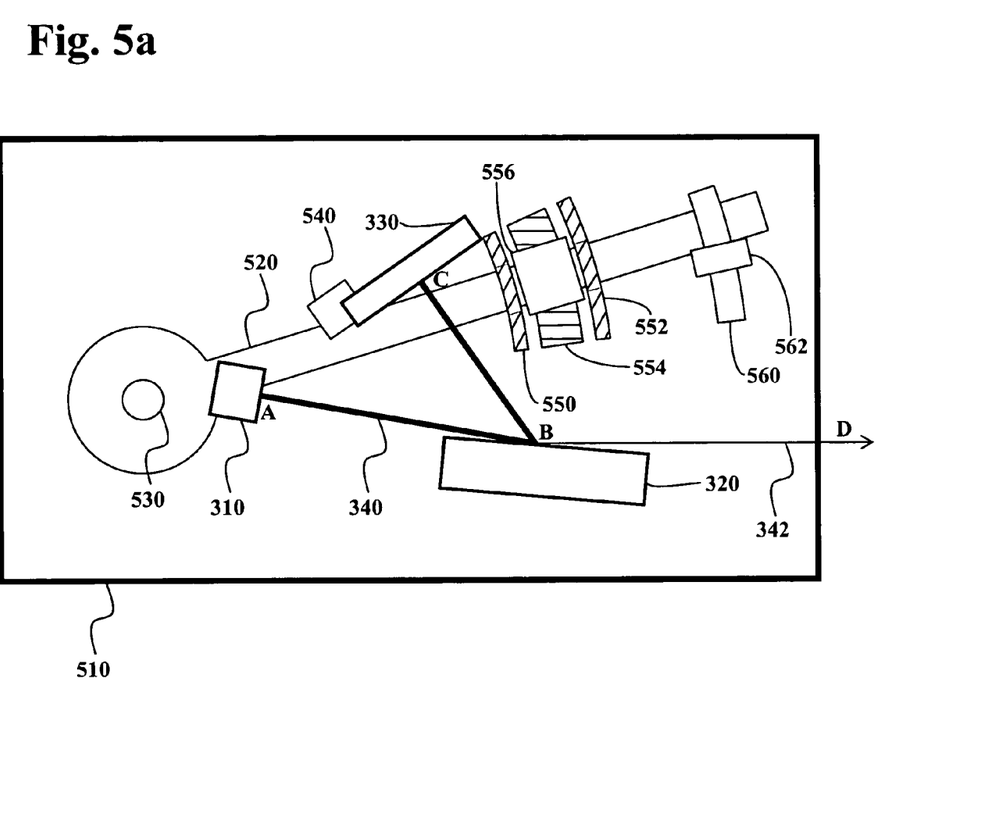
FIG. 5A shows an example of a tunable external cavity laser assembly.

FIG. 5A shows an example of a tunable external cavity laser assembly. The assembly contains a gain medium 310, a diffraction grating 320, a retroreflector 330, a frame 510, an actuator arm (or leaf) 520, a pivot bearing 530, a retroreflector holder 540, a first magnet 550, a second magnet 552, a center core 554, a coil winding 556, an encoder strip 560, and an encoder reader 562. A beam 340 is emitted by the gain medium 310 at point A. It diffracts off of the diffraction grating 320 at point B and reflects off of the retroreflector 330 at point C. The path of travel for the beam 340 of A–B–C comprises the cavity for the beam 340. Part of the beam 340 reflects off of the diffraction grating 320 and exits the assembly toward point D. The light that exits is the light output 342 of the system.

The pivot bearing 530 is attached to the frame 510. The actuator arm 520 pivots about the pivot bearing 530. The retroreflector holder 540 is attached to the actuator arm 520 and holds the retroreflector 330 in place. Ideally, the pivot bearing 530 is placed such that the retroreflector 330 rotates relative to the diffraction grating 320 and at the same time changes the cavity length such that the cavity length matches the wavelength of light selected. Of course, this may not be possible in the real world. Therefore, it is desirable to have another means of adjusting the cavity length.

The system can be configured to move either the gain medium 310 or the diffraction grating 320 along an axis that is parallel to the beam 340 between points A and B. Of course, it is also possible to move both the gain medium and the diffraction grating, but the end goal can be accomplished by moving either one or the other. It may help to think of pivoting the retroreflector 330 about the pivot bearing 530 as a course control and adjusting the distance between the gain medium 310 and the diffraction grating 320 as a fine control for adjusting the external cavity length.

Movement of the actuator arm 520 about the pivot bearing 530 may be accomplished, as shown in FIG. 5A, by a voice coil actuator. In this example, the coil winding 556 is attached to the actuator arm 520. A first magnet 550, a second magnet 552, and a center core 554 are attached to the frame 510. The first magnet 550, second magnet 552, center core 554, and coil winding 556 should be placed such that as the actuator arm 520 sweeps through its range of motion, the coil winding 556 does not contact the first magnet 550, the second magnet 552, or a center core 554. This is to minimize friction in the movement of the actuator arm 520 and also to prevent wear of the voice coil assembly.

The voice coil actuator shown in FIG. 5 is a toroidal coil rotary voice coil actuator. The inner magnet 550, the outer magnet 552, and the center core 554 are all shaped such that they have a curvature whose center is ideally the center of the pivot bearing 530. The coil winding 556 may or may not have this curvature.

A standard rotary voice coil actuator, such as those that are used in hard disk drives to control the read head actuator arm movement, can also be used. The advantage to the toroidal coil rotary voice coil is its compact size. By using the toroidal coil rotary voice coil a more compact form factor for the tunable external cavity laser can be achieved.

An encoder strip 560 is attached to the actuator arm 520. An encoder reader 562 is attached to the frame. As the actuator arm 520 sweeps through its range of motion the encoder strip 560 passes over the encoder reader 562, and the encoder reader senses the position of the actuator arm 520.

Using a closed loop feedback control system, which is not shown, position information collected from the encoder reader 562 can be used to control the position of the actuator arm 520. The amount of rotation for the actuator arm 520 shown in FIG. 5 is about 20°. Of course, depending upon the range of output from the gain medium 310, a larger or smaller rotational sweep may be more appropriate.

The advantages to using a voice coil actuator over other methods such as a DC servo motor or a stepper motor, both of which may or may not have a transmission assembly, include lower power consumption, better positional accuracy, and higher sweep rates. Experiments have shown that using a voice coil actuator for wavelength selection improves the possible frequency modulation speed of the tunable external cavity laser by at least 10 times when compared to other actuators. Actively controlling the cavity length to match the light output of the laser provides a mode hop suppression. There are several ways to actively suppress mode hop.

Figure 5B:
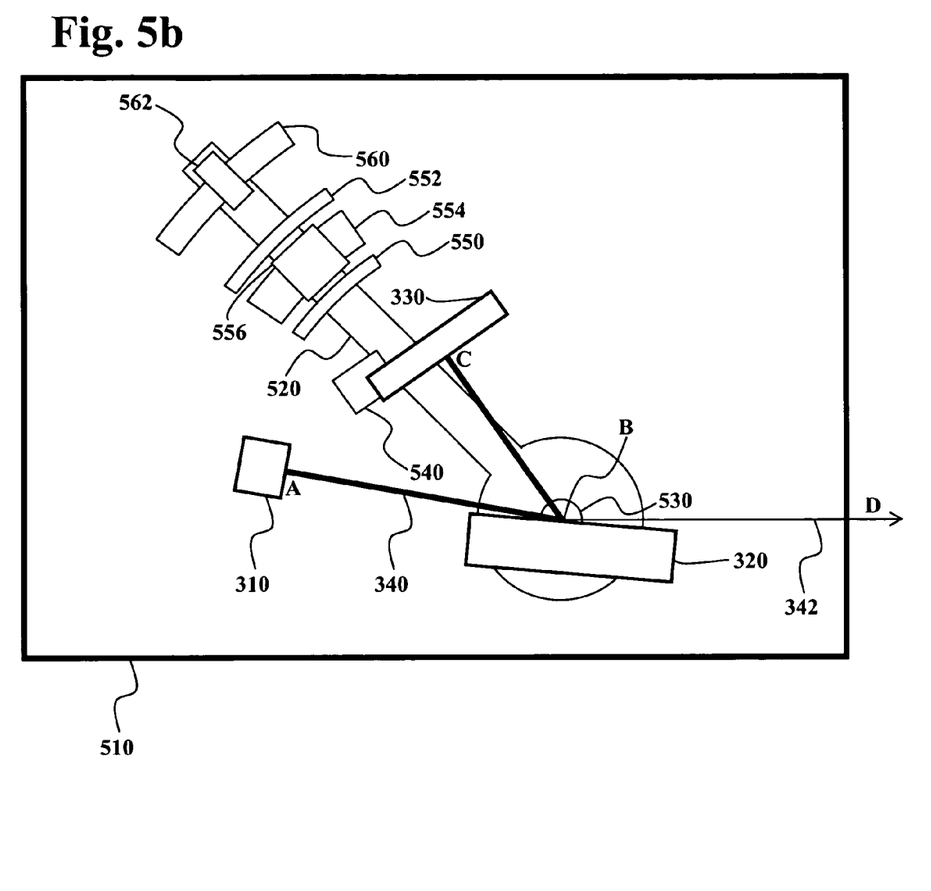
FIG. 5B shows an example of a tunable external cavity laser assembly.

FIG. 5B shows another example of a tunable external cavity laser assembly. The only difference between the assemblies shown in FIG. 5A and FIG. 5B is the location of the pivot bearing 530. In contrast to that shown in FIG. 5A, the pivot bearing 530 in FIG. 5B is positioned such that the center of the pivot bearing 530 is located at point B, i.e. the pivot bearing 530 is centered where the beam 340 strikes the diffraction grating 320. The retroreflector 330 rotates relative to the diffraction grating 320 about point B. Thus, the cavity length does not change as the retroreflector 330 rotates. It is desirable to have some means of adjusting the cavity length. For example, a linear voice coil attached to the gain medium 310, where the gain medium 310 moves along an axis that is parallel to the beam 340, can adjust the cavity length.

Figure 5C:
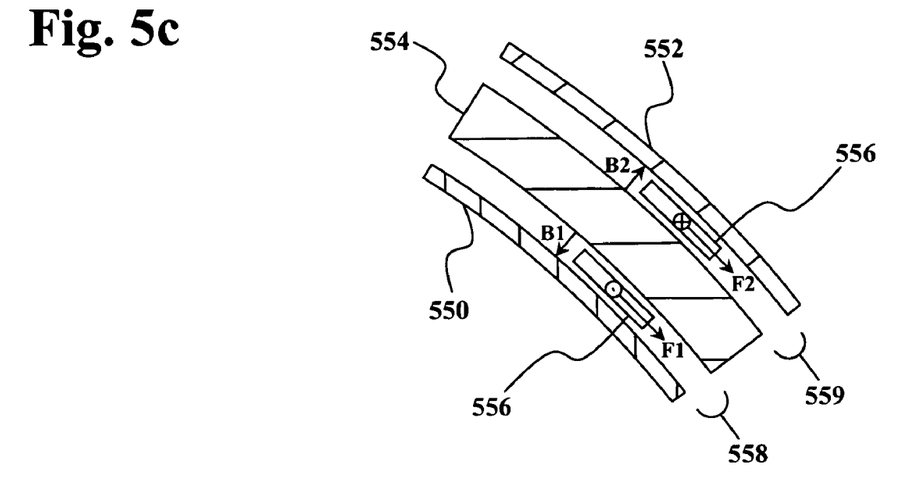
FIG. 5C shows a cross-section of a toroidal voice coil.

FIG. 5C shows a horizontal cross section of a toroidal voice coil. Components of the toroidal voice coil include an inner magnet 550, an outer magnet 552, a center core 554, and a coil winding 556. A first gap 558 between the inner magnet 550 and the center core 554 is ideally equal to a second gap 559 between the center core 554 and the outer magnet 552. Current flows in the coil winding 556. The part of the coil winding 556 in the first gap 558 shows the current coming out of the page with a resulting associated force F1. Likewise, the part of the coil winding 556 in the second gap 559 shows the current going into the page with a resulting associated force F2. Ideally, the magnets 550, 552 and center core 554 are curved such that their center of curvature is the center of rotation for the coil winding 556.

Ideally, the magnetic fields B1, B2 in the gaps 558, 559 from the magnets 550, 552 are radial and opposite in direction on either side of the center core 554. The path of coil current that is perpendicular to the magnetic fields from the magnets 550, 552 (vertical direction, or out-of-the-paper-plane, as shown in FIG. 5C) generates forces F1, F2 that acts in a direction perpendicular to both the magnetic fields B1, B2 and the current flow, which, in the configuration shown, is in the azimuthal direction. The magnitude of the force is proportional to the current, the magnetic fields B1, B2, and the number of turns in the coil winding 556. Because the actuator arm 520 is constrained to rotate around the pivot bearing 530, this force results in a torque that rotates the actuator arm 520.

Figure 5D:
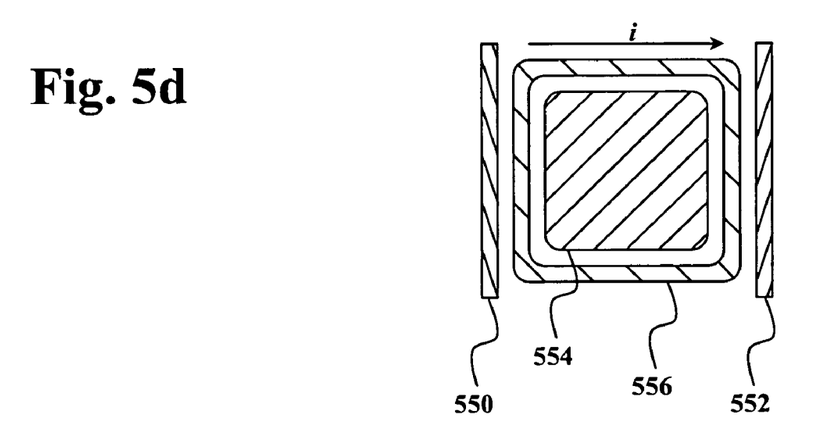
FIG. 5D shows a cross-section of a toroidal voice coil.

FIG. 5D shows an axial cross section of the toroidal voice coil shown in FIG. 5C. The direction of the current flowing through the coil winding 556 in shown with i.

Figure 6:
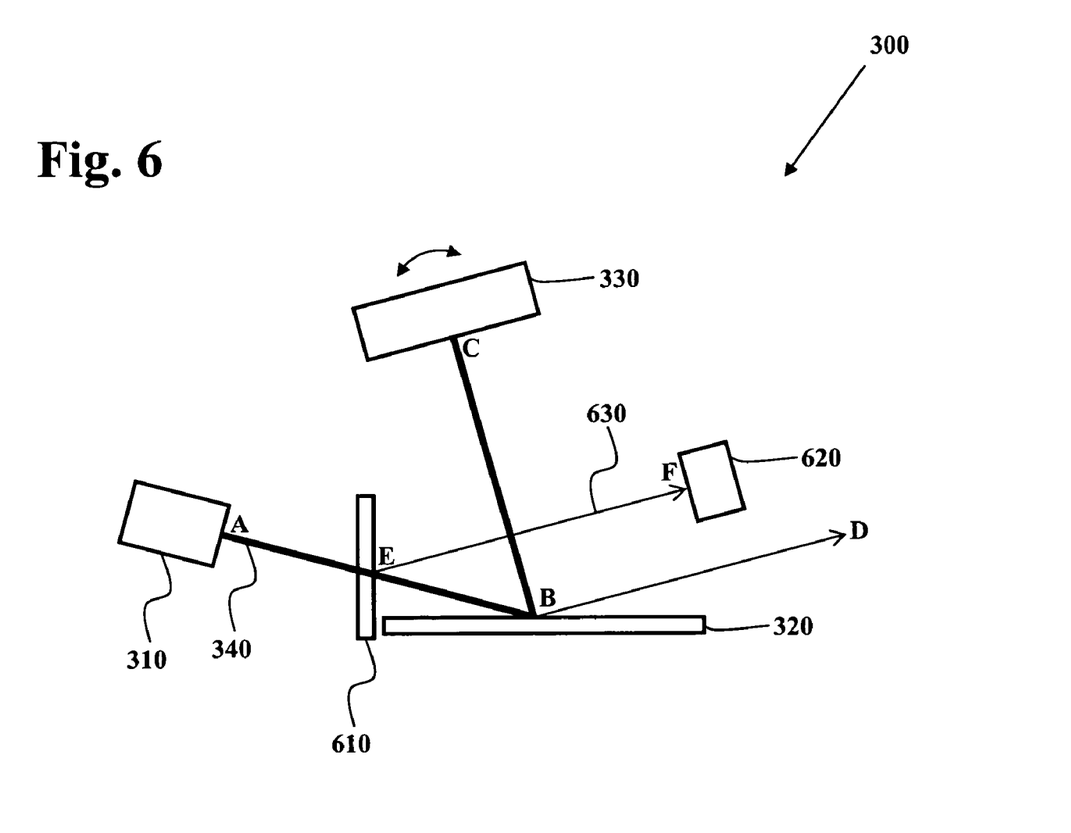
FIG. 6 shows a tunable external cavity laser with a pickoff and photodetector.

FIG. 6 shows an example of a tunable external cavity laser 300 with a pickoff 610 and a photodetector 620. The pickoff reflects part of the beam 340 at point E and directs it toward point F. The pickoff beam 630 terminates at a photodetector 620 capable of detecting directionality of light, such as a quadrant cell photodetector. By using a quadrant cell photodetector 620, changes in the directionality of the pickoff beam 630 can be detected. The directionality of the pickoff beam 630 is directly related to the cavity length for a desired wavelength of light. As the laser wavelength is tuned, the quadrant cell photodetector monitors the deviation of the pickoff beam 630 from the desired direction. By using a closed loop feedback control system, active control and synchronized change of the cavity length can be achieved. This provides mode hop free operation. Methods for controlling the cavity length are discussed above.

Figure 7:
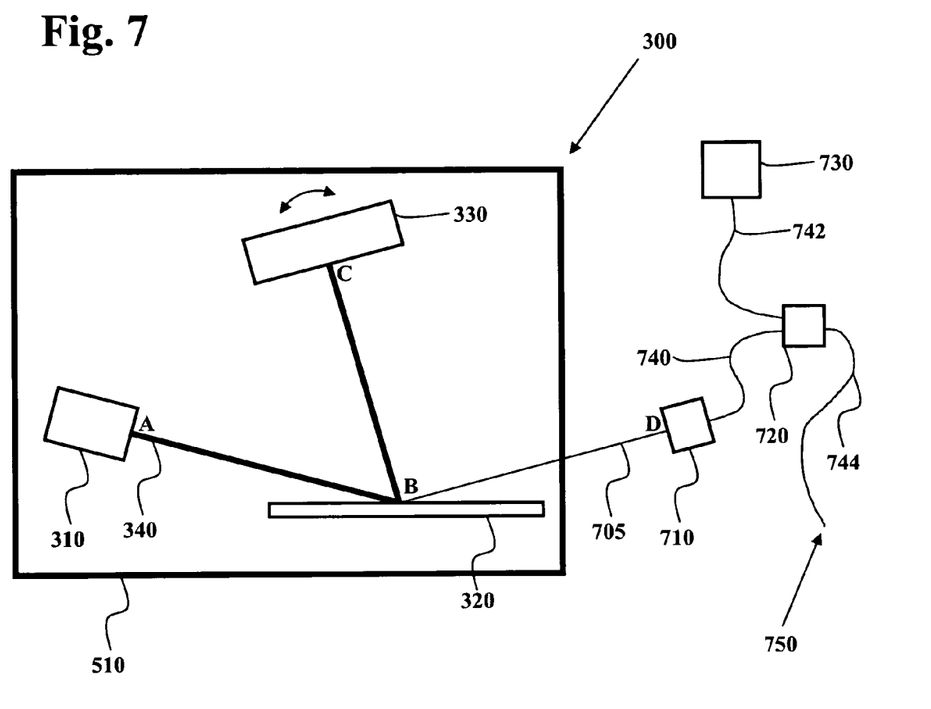
FIG. 7 shows a tunable external cavity laser with a fiber optic coupling and photodetector.

FIG. 7 shows an example of a tunable external cavity laser 300 with a fiber optic coupling 710 and a photodetector 730. A frame 510 is shown. The light output 705 of the tunable external cavity laser 300 is collected by a fiber optic coupling 710. The light then travels through an optical fiber 740 to an optical splitter 720. Most of the light continues along an optical fiber 744 as output from the system. Some of the light, however, travels through an optical fiber 742 to a photodetector 730. The photodetector 730 ideally is capable of measuring wavelength and phase of the light. Using this information the photodetector 730 monitors the light output 705 for any mode hop. By using a closed loop feedback control system information from the photodetector can be used to control the cavity length of the tunable external cavity laser 300, thereby suppressing mode hop from the light output 705. Again, methods for controlling the cavity length are discussed above.

Figure 8A:
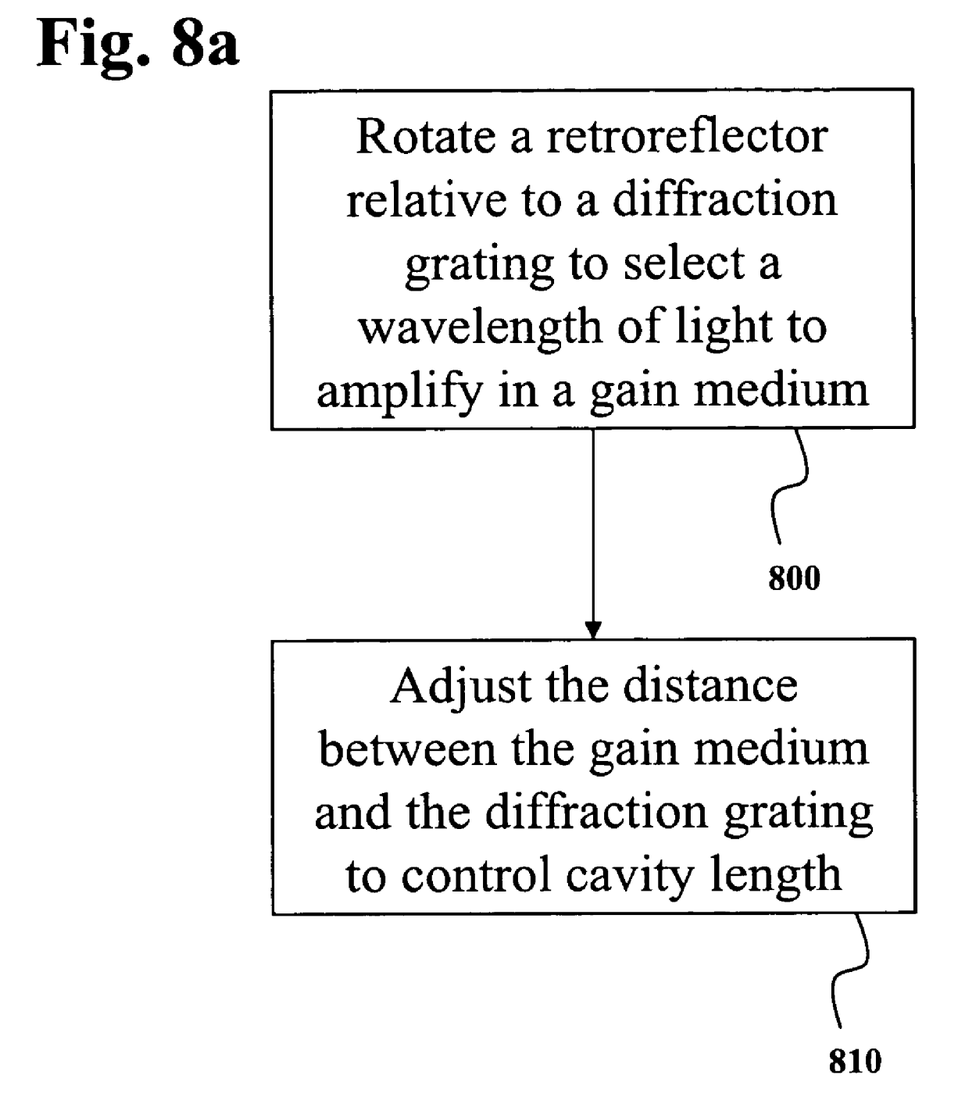
FIG. 8A shows a method of controlling light output from a tunable external cavity laser.

FIG. 8A shows a method of controlling light output from a tunable external cavity laser. In 800, a retroreflector is rotated relative to a diffraction grating to select a wavelength of light to amplify in a gain medium. In 810, the distance between the gain medium and the diffraction grating is adjusted to control the cavity length. By simultaneously controlling the selected wavelength and cavity length, a high bandwidth frequency modulated light output can be achieved while suppressing mode hop.

Figure 8B:
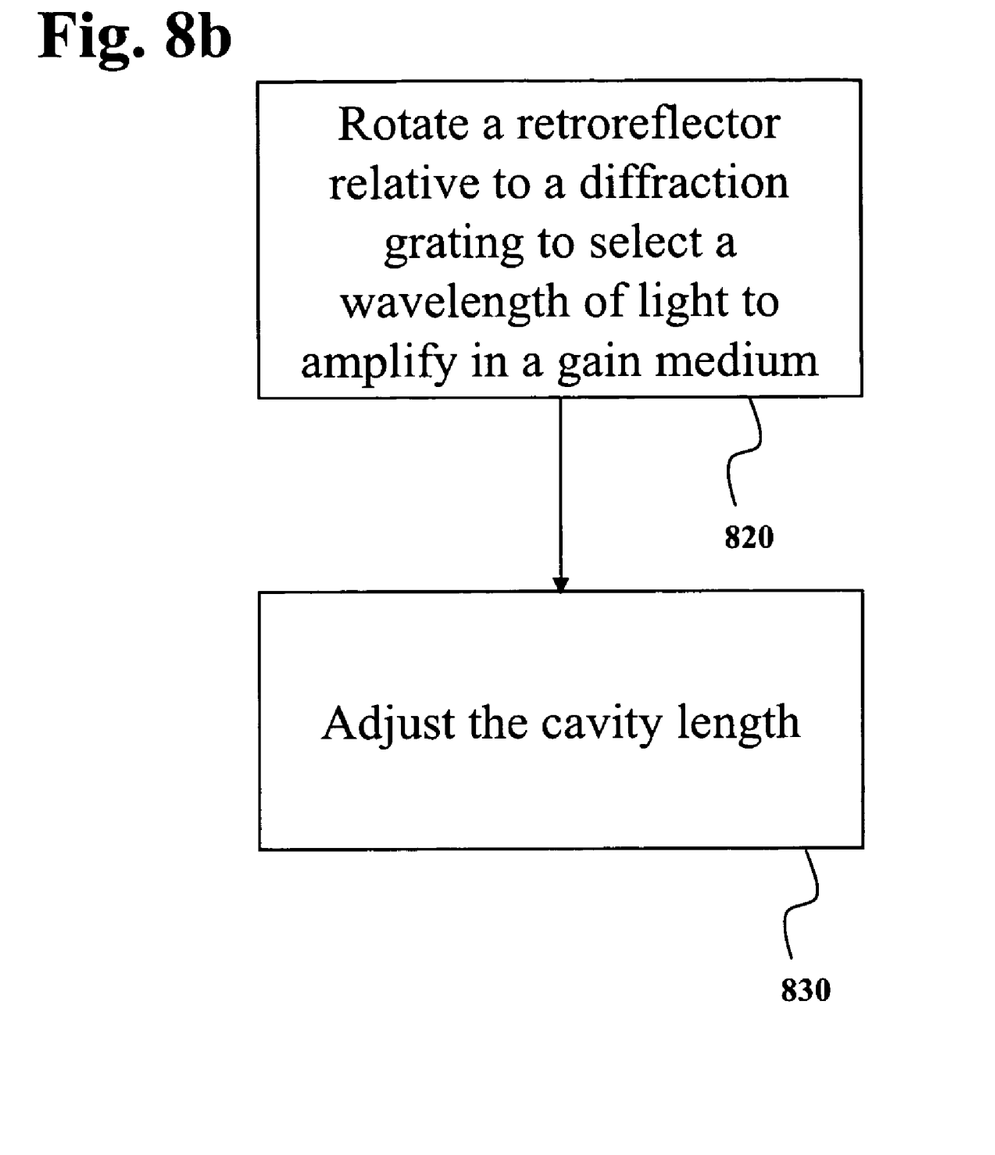
FIG. 8B shows a method of controlling light output from a tunable external cavity laser.

FIG. 8B shows another method of controlling light output from a tunable external cavity laser. In 820, a retroreflector is rotated relative to a diffraction grating to select a wavelength of light to amplify in a gain medium. In 830, the cavity length is adjusted.

Figure 9:
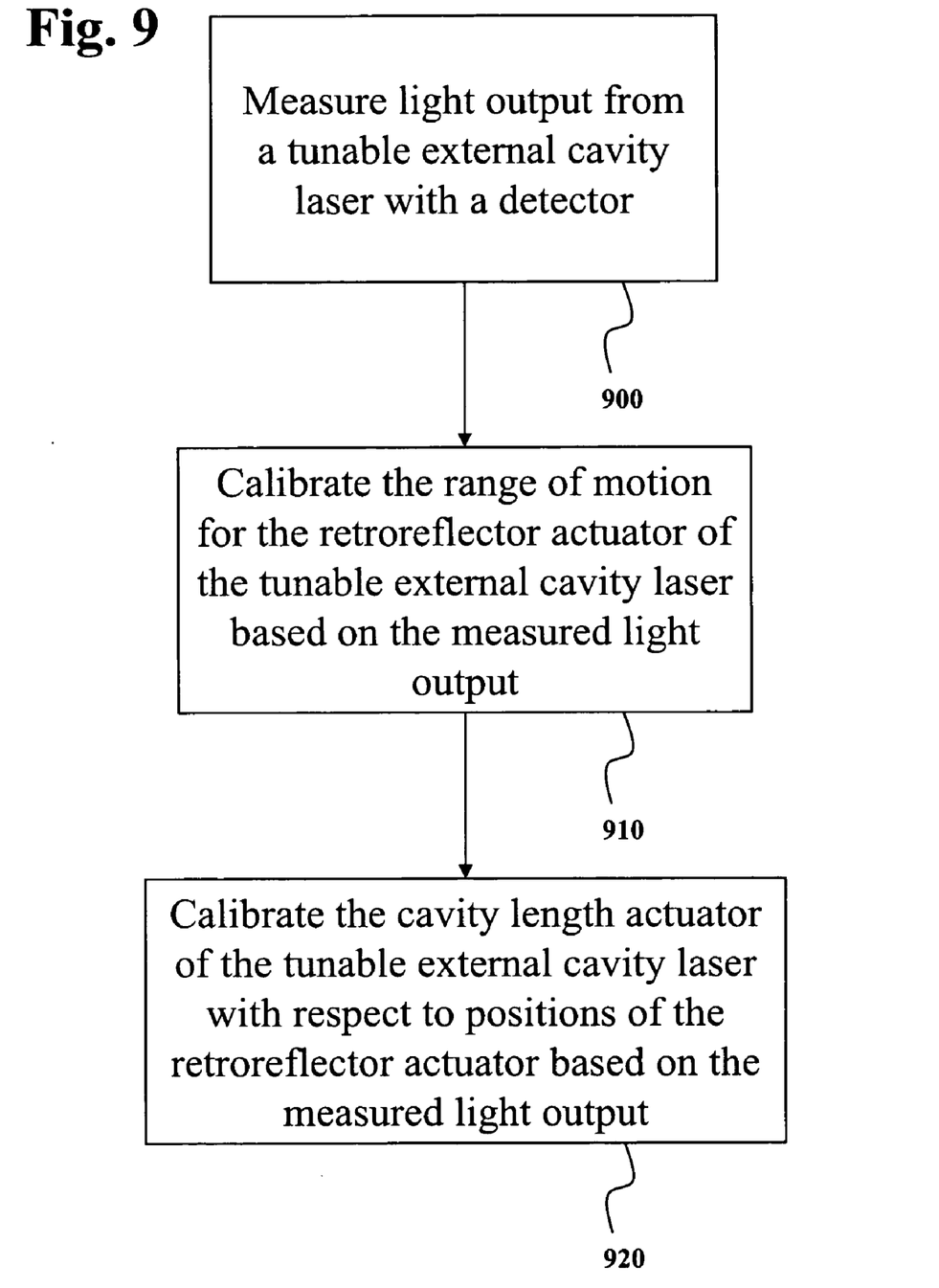
FIG. 9 shows a method of calibrating a tunable external cavity laser.

FIG. 9 shows a method of calibrating a tunable external cavity laser. In 900, light output from a tunable external cavity laser is measured with a detector. Ideally, the light output is measured over the wavelength output range of the laser. In 910, the range of motion for the retroreflector actuator of the tunable external cavity laser is calibrated based on the measured light output (see below). In 920 the cavity length actuator of the tunable external cavity laser is calibrated with respect to positions of the retroreflector actuator based on the measured light output. Ideally, each selectable wavelength has a corresponding retroreflector actuator position and cavity length. Storing this information allows fast, mode hop suppressed tuning of the tunable external cavity laser 300. Storing of the information also allows the laser to be calibrated at the factory and shipped without any type of active cavity length control. This can reduce the overall cost of the laser. But it may be desirable to ship the laser with a closed loop cavity length control in order to ensure error-free operation for the life of the product.

Figure 10:
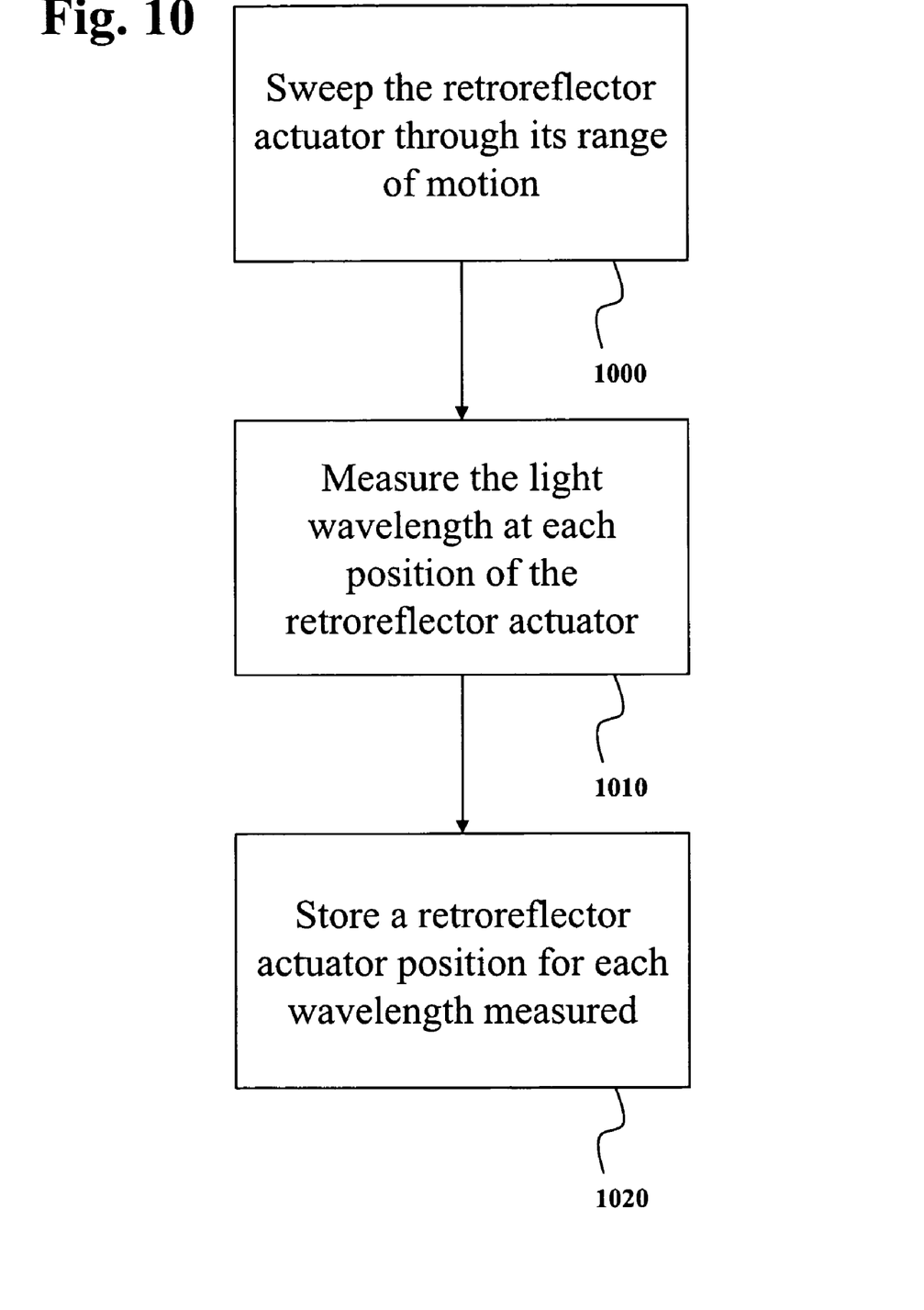
FIG. 10 shows a method of calibrating a range of motion for a retroreflector actuator.

FIG. 10 shows a method of calibrating a range of motion for a retroreflector actuator. In 1000, the retroreflector actuator sweeps through its range of motion. In 1010, the wavelength at each position of the retro reflector actuator is measured. Thus, each position in the range of motion for the retroreflector actuator has an associated light output wavelength. Based on all of the positions in the range of motion and their associated wavelengths, each selectable wavelength is ideally associated with a position of the retroreflector actuator. One way of selecting the position is to simply use the center of the range of positions of associated with an output wavelength. For example, if the actuator positions 100 through 200 yield a wavelength output of 1500 nm, the position 150 is associated with the wavelength of 1500 nm. In 1020, the retroreflector actuator position for each wavelength measured is stored. Storing associated retroreflector actuator position and wavelength pairs in memory allows very quick access to the information and lends itself to efficient retroreflector actuator position control.

It will be apparent to one skilled in the art that the described embodiments may be altered in many ways without departing from the spirit and scope of the invention. Accordingly, the scope of the invention should be determined by the following claims and their equivalents.

What is claimed is:

1. A system comprising:
   a gain medium which emits light;
   a diffraction grating spaced apart from the gain medium; and
   a retroreflector located to reflect light incident on the diffraction grating,
   where a distance between the gain medium and the diffraction grating is adjustable along an axis parallel to a direction of the light emitted by the gain medium, by an actuator which changes the distance only along that axis.

2. The system of claim 1, wherein the gain medium comprises a laser diode with an antireflective coating.

3. The system of claim 1, wherein the actuator comprises a piezoelectric actuator.

4. The system of claim 1, wherein the actuator comprises a voice coil actuator.

5. The system of claim 1, wherein the actuator is coupled to the gain medium.

6. The system of claim 1, wherein the actuator is coupled to the diffraction grating.

7. The system of claim 1, further comprising a detector located to measure one or more wavelengths of the light emitted from the gain medium, where a signal from the detector is coupled to a closed loop feedback system to control the distance between the gain medium and the diffraction grating.

8. The system of claim 7, wherein the detector measures phase of the emitted light.

9. The system of claim 1, further comprising a detector located to measure directionality of the light emitted from the gain medium, where a signal from the detector is coupled to a closed loop feedback system to control the distance between the gain medium and the diffraction grating.

10. The system of claim 9, wherein the detector comprises a quadrant cell photodetector.

11. The system of claim 9, further comprising a pick off located between the gain medium and diffraction grating.

12. The system of claim 1, further comprising an additional actuator coupled to the retroreflector, to rotate the retroreflector relative to the diffraction grating.

13. The system of claim 12, wherein rotation of the retroreflector is centered about a pivot positioned such that a cavity length of the system changes as the retroreflector rotates.

14. The system of claim 12, wherein rotation of the retroreflector is centered about a pivot positioned such that a cavity length of the system does not change as the retroreflector rotates.

15. The system of claim 12, further comprising an encoder coupled to measure a position of the retroreflector actuator.

16. The system of claim 15, wherein a signal from the encoder is coupled to a closed loop feedback system to control the position of the retroreflector actuator.

17. The system of claim 15, wherein a signal from the encoder is calibrated with respect to the distance between the gain medium and the diffraction grating.

18. The system of claim 17, wherein a signal from the encoder is used to control the distance between the gain medium and the diffraction grating.

19. The system of claim 12, wherein the actuator comprises a voice coil actuator.

20. The system of claim 19, wherein the voice coil actuator comprises a rotary voice coil actuator.

21. The system of claim 19, wherein the voice coil actuator comprises a toroidal coil rotary voice coil actuator.

22. A method of controlling light output from a tunable external cavity laser comprising:
   providing a gain medium emitting light onto a diffraction grating, and a retroreflector to reflect light from the diffraction grating;

rotating the retroreflector relative to the diffraction grating to select a wavelength of light to amplify in the gain medium; and adjusting a distance between the gain medium and the diffraction grating to control a cavity length of the laser, by an actuator which changes the distance only along an axis parallel to a direction of the emitted light.

23. The method of claim 22, wherein rotating the retroreflector is accomplished by an actuator.

24. The method of claim 23, wherein the actuator comprises a voice coil actuator.

25. The method of claim 22, wherein the actuator comprises a piezoelectric actuator.

26. The method of claim 22, wherein the actuator comprises a voice coil actuator.

27. The method of claim 22, wherein the actuator is coupled to the gain medium.

28. The method of claim 22, wherein the actuator is coupled to the diffraction grating.

29. The method of claim 22, wherein a closed loop feedback system controls rotation of the retroreflector.

30. The method of claim 22, wherein a closed loop feedback system coupled to the actuator controls a cavity length of the laser.

31. A tunable external cavity laser comprising:
a gain medium, comprising a laser diode with an antireflective coating;
a diffraction grating spaced apart from the gain medium;
a piezoelectric cavity length actuator adjusting a distance between the gain medium and the diffraction grating along an axis parallel to a direction of light emitted by the gain medium, the cavity length actuator coupled to the gain medium;
a retroreflector located to reflect the light incident on the diffraction grating;
a voice coil actuator coupled to the retroreflector and rotating the retroreflector relative to the diffraction grating;
an encoder measuring a position of the voice coil actuator, where a signal from the encoder is coupled to a first closed loop feedback system to control the position of the retroreflector; and
a detector measuring directionality of light emitted from the gain medium, where a signal from the detector is coupled to a second closed loop feedback system to control the distance between the gain medium and the diffraction grating.

32. A system comprising:
a gain medium which emits light;
a diffraction grating spaced apart from the gain medium;
a retroreflector located to reflect light incident on the diffraction grating; and
an actuator coupled to adjust the distance between the gain medium and the diffraction grating;
wherein the actuator is coupled to the gain medium, where a distance between the gain medium and the diffraction grating is adjustable along an axis parallel to a direction of the light emitted by the gain medium by the actuator.

33. A method of controlling light output from a tunable external cavity laser comprising:
providing a gain medium emitting light onto a diffraction grating, and a retroreflector to reflect light from the diffraction grating;
rotating the retroreflector relative to the diffraction grating to select a wavelength of light to amplify in the gain medium; and
adjusting a distance between the gain medium and the diffraction grating to control a cavity length of the laser;
wherein adjusting the distance between the gain medium and the diffraction grating is accomplished by an actuator coupled to the gain medium.

* * * * *